(12) United States Patent
Brannon et al.

(10) Patent No.: US 6,610,921 B1
(45) Date of Patent: Aug. 26, 2003

(54) METHOD AND APPARATUS FOR CONTAINING AND DIRECTING A FLOWABLE SUPERCONDUCTING SLURRY

(76) Inventors: Christopher John Brannon, 19352 Windwood Pkwy., Noblesville, IN (US) 46060; Gerard E. Parker, 1201 Colony Ct., Apt. 1, Zanesville, OH (US) 43701

( * ) Notice: Subject to any disclaimer, the term of this patent is extended or adjusted under 35 U.S.C. 154(b) by 455 days.

(21) Appl. No.: 09/645,178

(22) Filed: Aug. 24, 2000

(51) Int. Cl.[7] ............................................... H01L 39/00
(52) U.S. Cl. ...................... 174/15.4; 174/15.1; 505/150; 505/165
(58) Field of Search .............................. 174/15.4, 15.1; 257/661; 505/150, 165, 300; 335/216

(56) References Cited

U.S. PATENT DOCUMENTS

| | | | | |
|---|---|---|---|---|
| 3,588,312 A | * | 6/1971 | Burnier ...................... | 174/15.4 |
| 3,909,225 A | * | 9/1975 | Rooney ...................... | 62/51.1 |
| 4,992,623 A | * | 2/1991 | Briley et al. ................ | 505/220 |
| 5,026,681 A | * | 6/1991 | Hed ............................ | 505/165 |
| 5,248,656 A | * | 9/1993 | Nagesh et al. .............. | 505/434 |
| 5,859,386 A | * | 1/1999 | Herrmann et al. ......... | 174/15.5 |
| 6,342,673 B1 | * | 1/2002 | Verhaege et al. .......... | 174/15.5 |

* cited by examiner

*Primary Examiner*—Dean A. Reichard
*Assistant Examiner*—W. David Walkenhorst
(74) *Attorney, Agent, or Firm*—C. John Brannon

(57) ABSTRACT

A container system including a vessel for holding a thixotropic semi-solid aluminum alloy slurry during its processing as a billet and an ejection system for cleanly discharging the processed thixotropic semi-solid aluminum billet. The crucible is preferably formed from a chemically and thermally stable material (such as graphite or a ceramic). The crucible defines a mixing volume. The crucible ejection mechanism may include a movable bottom portion mounted on a piston or may include a solenoid coil for inducing an electromotive force in the electrically conducting billet for urging it from the crucible.

During processing, a molten aluminum alloy precursor is transferred into the crucible and vigorously stirred and controlledly cooled to form a thixotropic semi-solid billet. Once the billet is formed, the ejection mechanism is activated to discharge the billet from the crucible. The billet is discharged onto a shot sleeve and immediately placed in a mold and molded into a desired form.

33 Claims, 7 Drawing Sheets

METHOD AND APPARATUS FOR CONTAINING AND DIRECTING A FLOWABLE SUPERCONDUCTING SLURRY

TECHNICAL FIELD OF THE INVENTION

The present invention relates generally to ceramics, and, more particularly, to a method and apparatus for containing and directing a flowable superconducting slurry.

BACKGROUND OF THE INVENTION

The history of superconductivity begins in the early twentieth century. The phenomenon of superconductivity was discovered in 1911 by Heike Onnes as part of an investigation of the physical properties of mercury at very low temperatures. In 1946, Ogg observed superconductivity in very low temperature metal-ammonia solutions. In the early 1970's, alloys of niobium metal were found to be superconductive at liquid helium temperatures. In 1986, Bednorz and Miller observed superconductivity in a La—Ba—Cu ceramic oxide lattice at about 35 K. Shortly thereafter, a research team lead by C. W. "Paul" Chu announced the first material to superconduct above the liquid nitrogen threshold, a ceramic oxide having the general formula $Ba_2YCu_3O_{7-x}$. Since 1988, a number of materials that exhibit superconductivity above the liquid nitrogen temperature have been identified, including various Ba—Sr—Ca—Cu oxide compositions and Th—Ca—Ba—Cu oxide compositions.

Superconductors having critical temperatures ($T_c$'s—temperatures below which they behave as superconductors) above the temperature of liquid nitrogen (about 78 K at standard pressures) are very advantageous since the costs of cooling with liquid nitrogen are much less than the costs of cooling with liquid helium. Moreover, liquid nitrogen cooling systems are safer, less complicated, and less hazardous than liquid helium cooling systems.

Superconductors made from ceramic oxides also share several disadvantages. One such disadvantage of oxide ceramic superconductors is the requirement of very high purity raw materials. Ceramic oxide superconductors are extremely sensitive to impurities in the parts-per-billion range, which tend to form local non-superconducting regions within single superconducting oxide grains, degrading or destroying the superconductivity thereof. This make is extremely difficult to produce oxide superconducting powders having consistent grain-to-grain properties, and even more difficult to form bodies having consistent intra-body and/or extra-body superconductor properties.

Another disadvantage of ceramic oxide superconductors is their extreme sensitivity to slight variations in their processing environment. Slight differences in furnace temperature and/or oxygen partial pressure during annealing can result in different electrical properties (such as $T_c$, magnetic threshold $H_c$, and the like) in pieces formed from the same superconducting oxide batch. Ceramic superconducting oxides are especially sensitive to oxygen partial pressure during processing, since most tend to have an oxygen-deficient perovskite structure. In other words, ceramic superconducting oxides such as $Ba_2YCU_3O_{7-x}$, are non-stoichiometric permutations of the stoichiometric perovskite-structured composition $Ba_2YCU_3O_9$, wherein nearly ⅓ of the oxygen atoms have been removed. As a result, the material is very sensitive to the variations in processing occurring during the critical oxygenation step.

Still another disadvantage inherent in ceramic oxide superconductors is that they are relatively brittle. Even the "flexible" thin films or wires formed from oxide superconductor compositions are relatively brittle as compared to traditional metal wires.

Yet another disadvantage of ceramic oxide superconductors is that the superconducting oxide particles or grains tend to have anisotropic superconducting properties. Oxide superconductors have a multilayered crystal structure, and current tends to flow preferentially within the layers. Sintered ceramic oxide superconducting bodies tend to have randomized grain orientations, and so their current-carrying abilities are reduced to a fraction of the theoretical by the randomly oriented anisotropic grains. Moreover, the grain boundaries between the sintered grains also tend to be poor conductors, further limiting the current flow in a sintered ceramic oxide superconductor.

There is therefore a need for a ceramic oxide superconducting conduit having increased flexibility, homogeniety of properties, no grain boundary conductivity barriers. The present invention is addresses this need.

SUMMARY OF THE INVENTION

The present invention relates a flowable, formable high-temperature superconducting slurry. One form of the present invention includes a superconducting slurry formed of substantially spherical high-temperature superconducting oxide powder suspended in liquid nitrogen.

One object of the present invention is to provide an improved magnetic shielding apparatus. Related objects and advantages of the present invention will be apparent from the following description.

DETAILED DESCRIPTION OF THE PREFERRED EMBODIMENT

Figure 1:
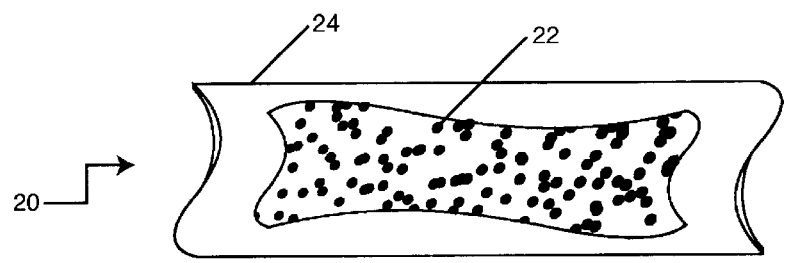
FIG. 1 is a partial sectional side elevational view of a conduit filled with a superconducting slurry of a first embodiment of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, and alterations and modifications in the illustrated device, and further applications of the principles of the invention as illustrated therein are herein contemplated as would normally occur to one skilled in the art to which the invention relates.

Figures 2A, 2B:
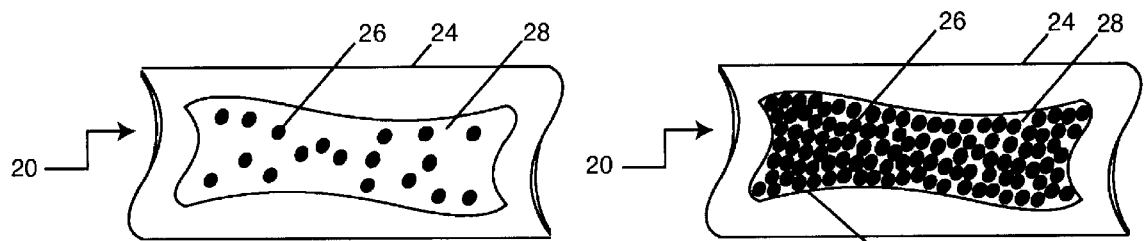
FIG. 2A is a partial sectional side elevational view of the conduit of FIG. 1 wherein the density of superconducting particles in the slurry is low.
FIG. 2B is a partial dectional side elevational view of the conduit of FIG. 1 wherein the density of superconducting particles in the slurry is high.

FIGS. 1–15 illustrate a first embodiment of the present invention, a bulk superconductor system 20 including a superconductor slurry 22 contained within an elongated conduit 24. The superconducting slurry 22 preferably includes particles 26 of a high $T_c$ superconducting ceramic oxide, such as $Ba_2YCU_3O_{7-x}$ or the like, suspended in liquid nitrogen 28. The concentration of superconductor particles 26 in the liquid nitrogen 28 matrix may be varied as desired. For example, it may be desired to maintain a high concentration of superconductor particles 26 in the slurry 22, such that each of the particles 26 is in physical contact with at least two other particles 26 in order to provide a conductivity path through the slurry 22. (See FIG. 2A). Also, a high concentration of superconducting particles 26 in the slurry 22 would increase its bulk magnetic threshold $H_c$, or the amount of magnetic flux necessary to break down superconductivity. Such a high concentration slurry 22 would be desirable if the system 20 were to be used for electrical power transfer or as a magnetic insulator. Alternately, a slurry 22 could be formed having lower concentration of superconducting particles 26, if it were desired for the system to not have bulk electrical conductivity or if a specific $H_c$ were desired. (See FIG. 2B).

Figure 3A:
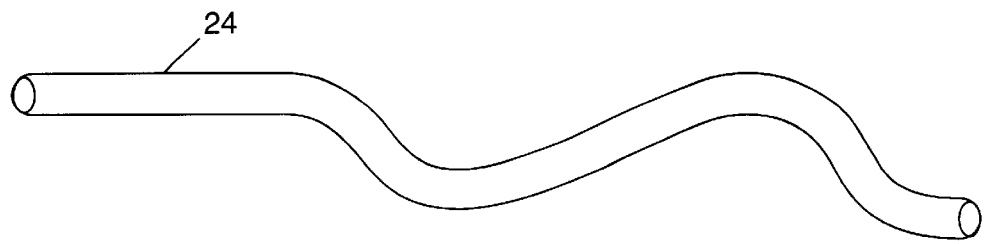
FIG. 3A is a perspective view of the conduit of FIG. 1.
Figure 3B:
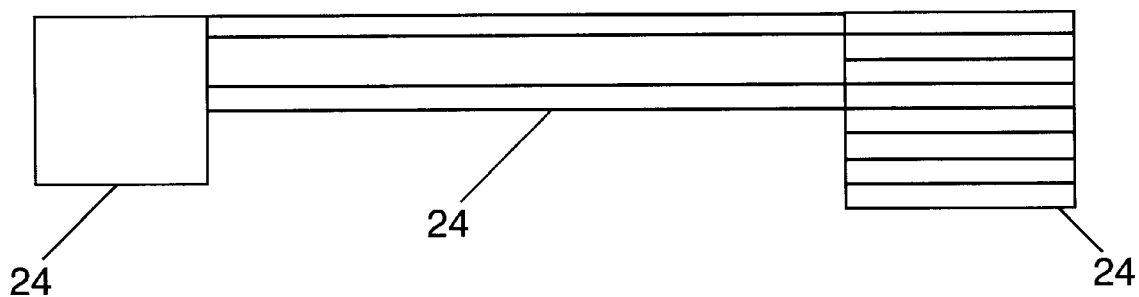
FIG. 3B is a schematic view of the conduit of FIG. 1 connected to a pump.

Referring to FIGS. 3A and 3B, the elongated conduit 24 is preferably a tube, pipe, or cryogenic hose that is at least somewhat flexible or ductile at room temperature. The elongated conduit 24 may itself be formed from an electrically conductive material, such as copper or steel, or may alternately be formed from an electrically insulating material such as rubber or polymer. FIG. 3B schematically illustrates the system 20, in which the conduit 24 is fluidically connected to a pump 29 adapted to circulate liquid nitrogen 28 or slurry 22 therethrough.

Figures 4A, 4B:
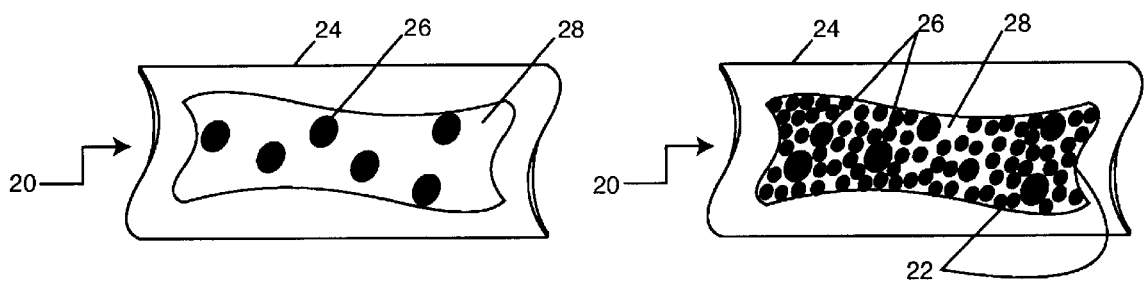
FIG. 4A is a partial sectional side elevational view of the conduit of FIG. 1 wherein the slurry is substantially monomodal.
FIG. 4B is a partial sectional side elevational view of the conduit of FIG. 1 wherein the slurry is substantially polymodal.

FIGS. 4A and 4B illustrate slurries 22 having different particle size distributions (PSDs). The slurry 22 illustrated in FIG. 4A has a PSD that is characterized as substantially monomodal. In other words, there is substantially only one size superconducting particle 26 represented in the slurry 22 of FIG. 4A. FIG. 4B illustrates a slurry 22 having a multimodal PSD which is made up of superconducting particles 26 having several distinct sizes. The PSD of the slurry 22 affects such parameters as particle density, slurry viscosity, and thixotropy.

In operation, as an electrical power conductor the slurry 22 could be pumped either mechanically or by gravitational flow to the point of use. The slurry 22 need only be cooled to the required $T_c$ thus reducing the energy requirements. Since there are no Joule heating losses in an electrical superconductor (line resistance is zero), the only energy loss consideration is the energy input necessary to maintain the nitrogen in a liquid state. Moreover, the slurry 22 could be used to transmit either AC or DC power directly to the consumer. The primary advantage of AC power is that alternating current can be transmitted through electrically conducting cables with substantially less power loss from Joule heating ($I^2R$) than can direct current. The superconducting slurry 22 can be used to transmit power with no line loss. Given a closed system having appropriate insulation, the energy required to maintain a liquid nitrogen based slurry is minimal compared to the power losses associated with transmitting AC current through conventional electrical cables. Likewise, the slurry 22 may be used to transmit information in the form of electrical signals or impulses with little or no attenuation or distortion.

Figure 5:
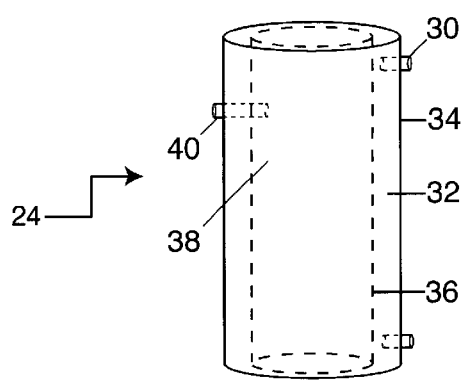
FIG. 5 is a partial sectional view of a double-walled vessel for containing superconducting slurry.

FIG. 5 illustrates a double-walled conduit 24 having an exterior valve 30 communicating with a first conduit portion 32 defined between the outer and inner conduit walls 34, 36. A second conduit portion 38 is defined radially inward of inner conduit wall 36 and may be accessed by a second valve 40. Slurry 22 may be flowed through the first conduit portion 32, the second conduit portion 38, or both 32, 38.

In operation as a magnetic shielding device, the first conduit portion 32 is filled with slurry 22. The diamagnetic slurry 22 resists penetration of a magnetic field therethrough, thereby defining a magnetically insulated inner volume. The $H_c$ of the slurry 22 is a function of the superconducting particle density therein, and may therefore be controlled by controlling the superconductor particle density of the slurry 22, such that the critical breakdown strength of the magnetic shield thereby formed may be precisely controlled.

The container is illustrated as having the shape of a right circular cylinder, thereby defining an interior magnetically shielded volume of the same shape. However, the container can be formed having any desired size and shape (either regular or irregular) to define a magnetically shielded interior volume of the same desired shape.

Figure 6A:
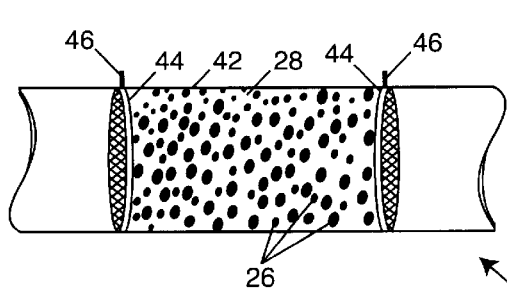
FIG. 6A is a partial sectional side elevational view of the conduit of FIG. 1 including a pair of screens defining a slurry-containing region therebetween.
Figure 6B:
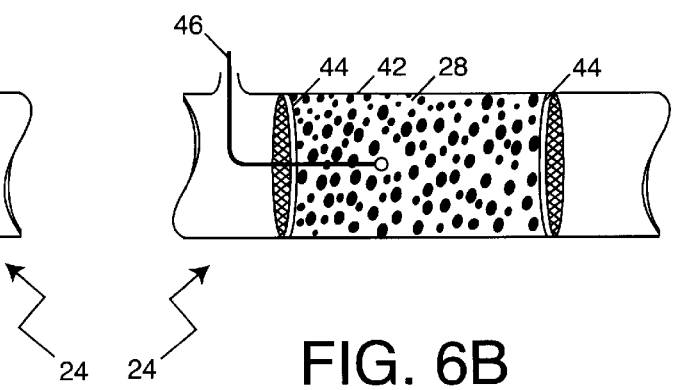
FIG. 6B is a partial sectional side elevational view of the conduit of FIG. 1 including a pair of screens defining a slurry containing region therebetween and having a wire extending through the conduit and into the slurry containing region.

FIG. 6A illustrates a conduit 24 having at least one slurry containing portion 42 defined by a pair of screens 44. The slurry containing portion 42 of the conduit 24 is in fluid communication with the remaining portions of the conduit 24 (i.e., liquid nitrogen 28 passes substantially freely through the screens 44, but superconducting particles 26 do not). The superconducting portion of the conduit is therefore the slurry-containing portion 42. FIG. 6B illustrates the inclusion of an electrically conducting wire 46 extending through the conduit 24 and through the screen 44, such that the superconducting portion 42 is in electrical communication with the exterior of the conduit 42. The wire 46 may be formed from a superconductor material or from a conventional electrical conductor material.

In operation, the screens would separate the superconducting slurry 22 from the coolant, defining a predetermined area of use. This separation would reduce the amount of superconductor material required by restricting the superconductor material to the predetermined area of use. This configuration also enhances the shielding effects of the slurry 22 by allowing a single conduit 24 to define spaced area of shielding and non-shielding.

Figure 7:
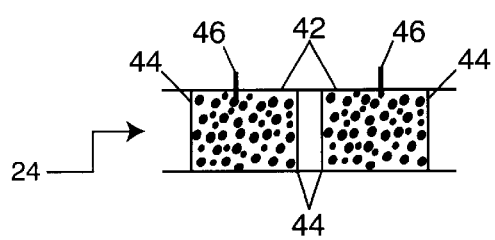
FIG. 7 is a partial sectional side elevational view FIG. 1 illustrating two spaced slurry containing regions.

FIG. 7 illustrates a conduit 24 configuration including four screens 44 defining two slurry containing portions 42 positioned relatively close to each other. Each slurry-containing portion 42 includes a wire 46 extending therefrom through the conduit 24 to provide electrical communication therewith.

In operation, this configuration may be used to define a capacitative circuit element. Moreover, this configuration may be used to create a layering effect of magnetic shielding, i.e. partial magnetic shielding may be achieved to finely control the application of a magnetic field therethrough. One application for such a finely controlled magnetic field is in precision switching. Fine control can be achieved by varying such parameters as separation distance between the slurry-containing and non-slurry-containing portions of the conduit 24 and by varying the thicknesses of the slurry-containing and non-slurry-containing portions. Also, a magnetic oscillator could be built by placing a permanent magnet between the spaced diamagnetic (i.e., slurry-containing) portions of the conduit 24.

Figure 8:
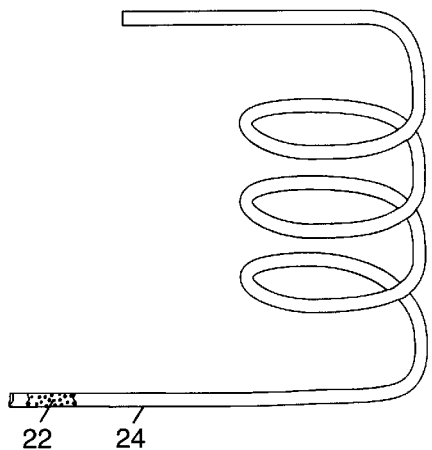
FIG. 8 is a partial sectional perspective view of FIG. 1 illustrating the conduit formed into a coil.

FIG. 8 illustrates a conduit 24 formed as a coil or helix through which superconducting slurry 22 is flowed. The coil defines an interior volume at least partially shielded from external magnetic fields.

In operation, current is passed through the superconducting slurry 22 in the coiled conduit 24. As the current density changed, the conducting coil behaves as an inductor. The magnetic field so generated within the inductor coil is especially well contained and shielded by the diamagnetic superconductor slurry 22.

Figure 9:
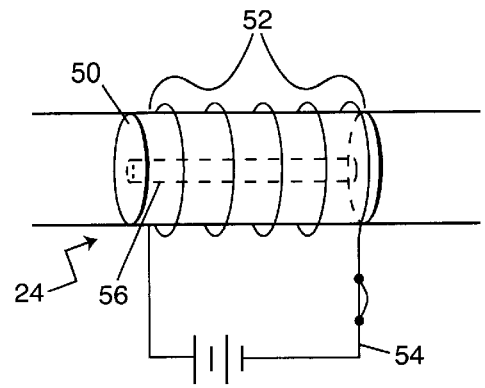
FIG. 9 is a partial sectional side elevational view of FIG. 1 illustrating a switch formed in the conduit.
Figure 10:
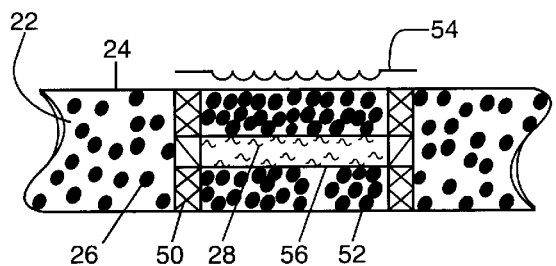
FIG. 10 is a partial sectional side elevational view of FIG. 1 illustrating a switch formed in the conduit.

FIGS. 9 and 10 illustrate a conduit including a first and second superconducting partial screen 50 defining a switch portion 52 therebetween. The partial screens 50 are adapted to allow the passage of liquid nitrogen 28 therethrough and block the passage of superconducting particles 26. Superconductor particles 26 fill the conduit 24, including the switch portion 52. A resistor coil 54 is positioned in thermal communication with the switch portion 52 and connected to a controlled electrical power source (not shown.) In FIG. 9, the resistor coil 54 encircles the switch portion 52, while in FIG. 10 the resistor coil 54 is positioned adjacent the switch portion 52. An inner conduit portion 56 free of superconducting particles 26 may be included through which liquid nitrogen 28 may flow. Additionally, the partial screens 50 may be adapted to pass liquid nitrogen only through the inner conduit portion 56, such that the remaining volume of the switch portion is filled with dry superconductor particles 26.

In operation, the resistor coil 54 is activated by the flow of electricity therethrough and generates heat. The resistor 54 provides heat to the slurry 22, heating the superconductor particles above $T_c$, such that they no longer superconduct. Thus, activation of the resistor coil 54 acts to switch the conduit 24 off, cutting the flow of power therethrough. Pulsing power through the resistor coil 54 could allow oscillations of current through the conduit 24, as the temperature of the superconductor particles alternately exceeds and falls below $T_c$. This configuration may therefore be used to transmit magnetic waves.

Figure 11:
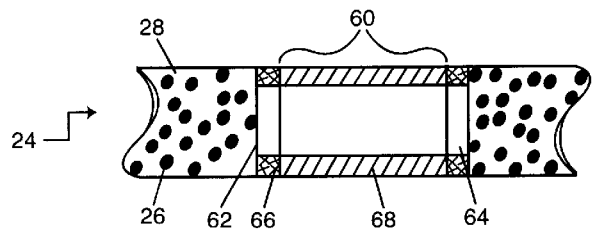
FIG. 11 is a partial sectional side elevational view of FIG. 1 illustrating a resistor formed in the conduit.

FIG. 11 shows a conduit 24 having a resistor portion 60 defined between two partial screens 62. The partial screens have a central portion 64 through which liquid nitrogen 28 but not superconductor particles 26 may pass and an outer ring portion 66. The outer ring portion 66 is preferably formed from an electrical conductor and is more preferably formed from a high $T_c$ superconductor. A resistor layer 68 is formed in the resistor portion 60, extending between the partial screens 62 in electric communication with the outer ring portions 66.

In operation, the partial screens 62 allow liquid nitrogen 28 to pass through the resistor portion 60, but prevent any superconductor particles 26 from passing therethrough. In other words, no slurry 22 is allowed to pass through the resistor portion 60. When power is transmitted through the conduit 24, the resistor potion 60 behaves as a resistor, i.e., current flow is resisted and heat is generated therein according to $I^2R$. In this way, resistor circuit elements may be introduced into the superconducting conduit 24.

Figure 12A:
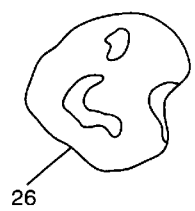
FIG. 12A is a perspective view of a superconducting particle of FIG. 1.
Figure 12B:
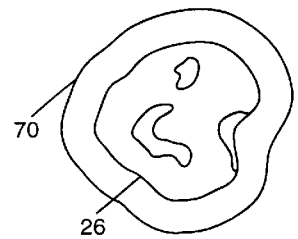
FIG. 12B is a perspective view of a coated superconducting particel of FIG. 1.

FIG. 12A illustrates a typical substantially spherical superconductor particle 26. Preferably, the superconducting particle is formed from a high $T_c$ oxide superconductor such as $Ba_2YCU_3O_{7-x}$, but may be formed from any superconducting material with a $T_c$ above the boiling point of liquid nitrogen. FIG. 12B illustrates a typical substantially spherical superconductor particle 26 having a nonconducting shell 70 formed thereabout. The nonconducting shell 70 is preferably formed from TEFLON, but may be formed from any convenient electrically insulating material.

The electrical conductivity of a slurry 24 formed from such particles is a function of the particle-to-particle contact or connectivity within the slurry. It is preferred that the superconducting particles 26 are substantially spherical to maximize contact and flowability. It is also preferred that the particle density of the slurry 24 be as great as possible while still allowing a flowable slurry 24.

A superconducting slurry 24 formed using the coated particles 26 would exhibit the diamagnetic properties associated with a superconductor, but not the electrical current conducting properties. Such a slurry would be ideal for use in applications requiring magnetic and electrically insulative shielding. Such shielding could be used to insulate a powerful magnetic field without the generation of eddy currents in the insulator. The coating 70 also serves to protect the particles 26 from any dissolving agents they might otherwise come into contact with.

Figure 13:
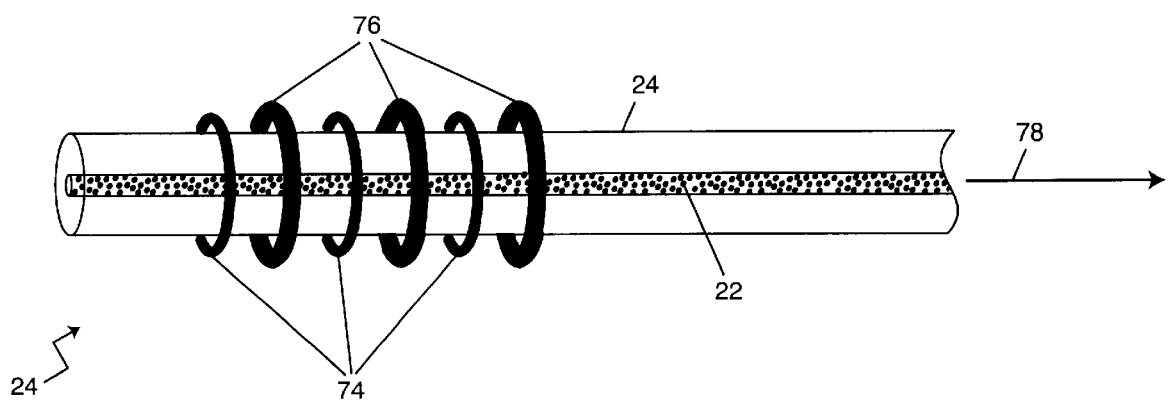
FIG. 13 is a side elevational schematic view of illustrating the conduit of FIG. 1 passing through a series of permanent magnets alternating with coil windings.

FIG. 13 illustrates another embodiment of the present invention, an alternating series of circular magnets 74 and wound coils 76 with a central axis 78 passing therethrough. A conduit 24 containing superconducting slurry 22 is positioned substantially coaxially with the axis 78 and extending through the magnets 74 and coil 76. The magnets 74 may be electromagnets, permanent magnets, or a combination of both. The coils 76 are adapted to conduct electricity.

In operation, the magnetic field will resist the passage of the diamagnetic slurry 24 therethrough. The kinetic energy required to push the slurry 24 through the magnetic field established by the permanent magnets 74 is transduced into electrical current in the coil 76. In other words, the change, due to the passage of the diamagnetic slurry material passing therethrough, in field strength in the field produced by the permanent magnets 74 induces an electric current in the coil.

Figure 14:
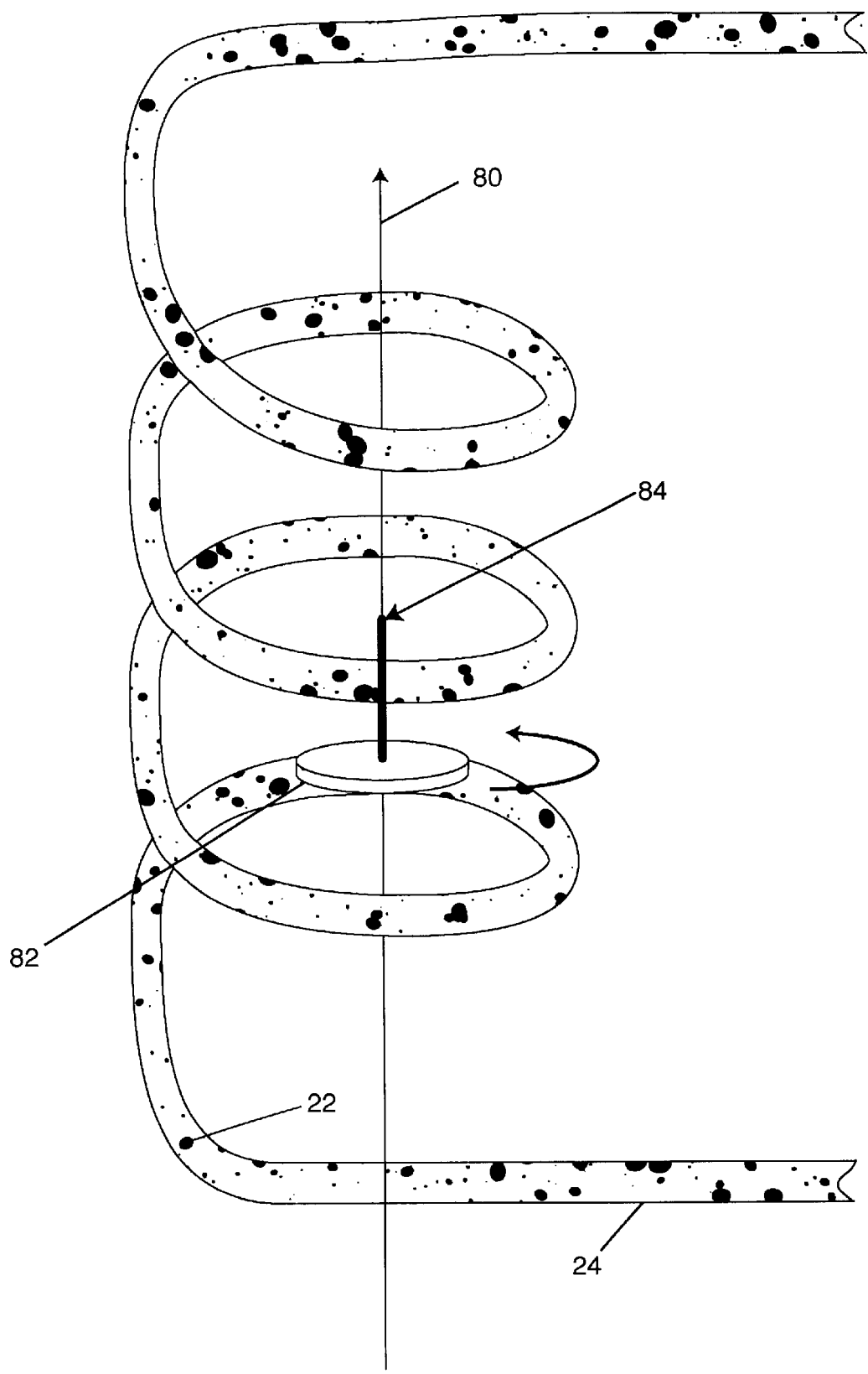
FIG. 14 is a perspective view of the conduit of FIG. 1 formed into a coil and having a permanent magnet suspended therein.

FIG. 14 illustrates yet another embodiment of the present invention, a conduit 24 filled with superconducting slurry 22 and wound into a helix or coil having a central axis 80. A cylindrical permanent magnet 82 having a cylindrical axis 84 is suspended coaxially with the coil. Preferably, the magnet 82 is spinning about its cylindrical axis 84. The conduit 24 is connected to a current source (not shown).

In operation, the core of the helix defines a diamagnetic or magnetically shielded volume in which an appropriately sized and shaped permanent magnet may be suspended. The permanent magnet may be coupled to a variety of devices to achieve a variety of net effects. For example, the magnet may be used as a dashpot for precision measurement of forces or as a damper for absorption of forces (this would be especially conducive for use in spacecraft). The shock absorber could be actuated just prior to use (such as in landing or docking operations) by pumping the slurry 22 (or the coolant to form a slurry 22) through the helix.

Figure 15:
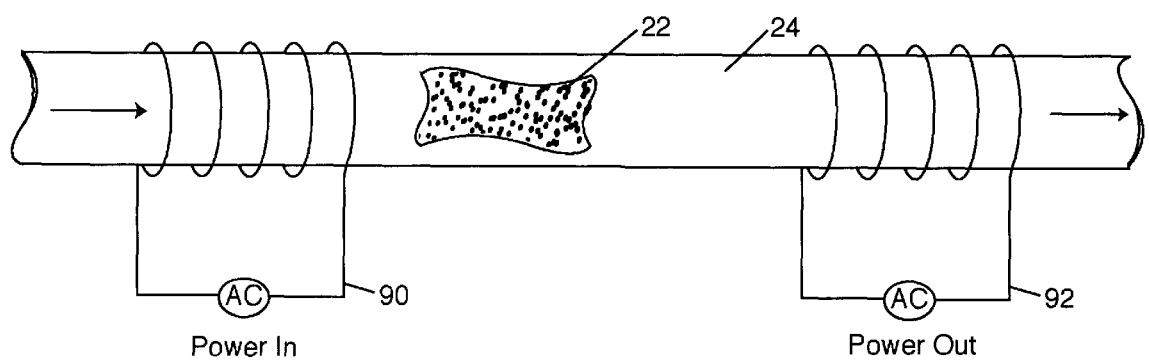
FIG. 15 is a partial sectional side elevational view of the conduit of FIG. 1 having a pair of spaced inductors positioned therearound.

FIG. 15 illustrates a conduit 24 carrying flowing superconducting slurry 22. A first induction coil 90 is placed around one portion of the conduit 24, and a second, spaced induction coil 92 is similarly wrapped around a second portion of the conduit 24.

If an alternating current is passed through the first coil 90, a similar current is generated in the slurry 22. The current may be transmitted through the conduit 24 to the second coil 92. The current flowing through the conduit 24 may then be used to induce a current in the second coil 92. In this way, power may be transmitted through the superconducting slurry 22 in the conduit 24 with no energy loss from Joule heating or from leakage of the coolant 28 the power extraction point.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

We claim:

1. A flexible superconductor system, comprising:
   an elongated conduit;
   a substantially superconducting slurry formed from substantially spherical superconducting particles suspended in liquid coolant and at least partially filling the elongated conduit; and
   a pump in liquid communication with the elongated conduit;
   wherein the pump is adapted to pressurize the liquid nitrogen in the elongated conduit; and
   wherein the superconducting particles are characterized by a $T_c$ greater than the boiling point of the liquid coolant.

2. The system of claim 1 wherein the liquid coolant is liquid nitrogen.

3. The system of claim 1 further comprising a first filter and a second filter; wherein the elongated conduit is a length of flexible tubing; wherein the first and second filters positioned in the length of flexible tubing defining a slurry-containing region therebetween; wherein the filters are adapted to allow liquid nitrogen to flow therethrough; and wherein the filters are further adapted to retain the substantially spherical superconducting particles.

4. The system of claim 3 further including a first and a second superconducting wire extending through the first and second filters, respectively, wherein the first and the second superconducting wire extend through the tubing.

5. The system of claim 4 wherein the first and the second filters are electrically conductive and wherein the first and the second filters extend through the tubing.

6. The system of claim 1 wherein the elongated conduit is copper tubing.

7. The system of claim 1 wherein the elongated conduit is a cryogenic hose.

8. The system of claim 1 further comprising a first electric coil positioned around the tubing and a second electric coil positioned around the tubing and spaced from the first electric coil.

9. The system of claim 8 wherein the first electric coil is electrically connected to an AC power source, wherein AC current is conducted through the first electric coil, wherein current is induced to flow through the superconducting slurry, and wherein current is induced to flow through the second electric coil.

10. The system of claim 1 wherein the elongated conduit is a double walled container, wherein the double walls define a working space therebetween, and wherein the working space is adapted to be filled by the slurry.

11. The system of claim 10 further comprising an inlet valve formed through the elongated conduit and an outlet valve formed through the elongated conduit, wherein the working space is in liquid communication with the inlet valve and the outlet valve.

12. The system of claim 1 wherein the elongated conduit is coiled to define an interior volume substantially shielded from magnetic flux.

13. The system of claim 1 wherein an electric current is conducted through the superconducting slurry.

14. The system of claim 1 wherein the elongated conduit is coiled to define an inductor and wherein electric current is conducted through the superconducting slurry.

15. The system of claim 1 further comprising:
    a first pair of filters positioned in the elongated conduit and defining a first chamber therebetween;
    a second pair of filters positioned in the elongated conduit and defining a second chamber therebetween;
    a first electrically conducting lead extending from the first chamber through the elongated conduit; and
    a second electrically conducting lead extending from the second chamber through the elongated conduit;
    wherein the first pair of filters is spaced apart from the second pair of filters; and
    wherein the superconducting slurry is contained in the first chamber and in the second chamber.

16. The system of claim 15 wherein the first chamber is positioned substantially adjacent the second chamber, wherein an electrical insulator is positioned between the first and second chambers, and wherein the first chamber contains a first electrical charge, and wherein the second chamber contains a second, opposing electrical charge.

17. The system of claim 1 further comprising:
    a pair of filters defining a chamber therebetween; and
    a heater positioned around the elongated conduit between the filters;
    wherein the chamber is at least partially filled with the superconducting slurry; and
    wherein actuation of the heater raises the temperature of the superconducting slurry above $T_c$.

18. The system of claim 1 further comprising:
    a first filter positioned in the elongated conduit and having a radially inner portion adapted to allow liquid nitrogen to flow therethrough and a radially outer portion adapted to prevent the flow of liquid nitrogen therethrough;
    a second filter positioned in the elongate conduit and having a radially inner portion adapted to allow liquid nitrogen to flow therethrough and a radially outer portion adapted to prevent the flow of liquid nitrogen therethrough;

a chamber defined between the first and the second filters;

an inner conduit having extending between the radially inner portion of the first filter and the radially inner portion of the second filter and adapted to conduct liquid nitrogen therethrough;

superconducting oxide particles filling the chamber between the radially outer portions of the first and the second filters; and a heater positioned around the elongated conduit between the filters;

wherein actuation of the heater raises the temperature of the superconducting oxide particles above $T_c$.

19. An apparatus for containing and directing a superconductor, comprising:

an elongated tube; and a superconducting slurry at least partially filling the tube;

wherein the tube is substantially flexible at room temperature;

wherein the superconducting slurry includes superconducting particles suspended in liquid nitrogen; and wherein the superconducting particles have a $T_c$ greater than the boiling point of liquid nitrogen.

20. The apparatus of claim 19 wherein the tube is coiled to define a magnetically insulated inner volume.

21. The apparatus of claim 19 wherein the concentration of superconducting particles is such that each superconducting particle is in physical contact with at least two other particles.

22. The apparatus of claim 19 wherein electric current is conducted through the superconducting slurry.

23. The apparatus of claim 19 further comprising a first electric coil positioned around the elongated tube and a second electric coil positioned around the elongated tube, wherein the second coil is spaced from the first coil.

24. The apparatus of claim 23 wherein AC current is conducted through the first electric coil and wherein AC current is induced to flow through the superconducting slurry at least partially filling the tube.

25. A bulk superconductor, comprising:

a cryogenic hose having a proximal end and a distal end;

a superconducting slurry at least partially filling the hose, comprising:

liquid nitrogen;

ceramic oxide superconducting particles having a $T_c$ in excess of the boiling point of liquid nitrogen;

wherein the ceramic oxide particles are suspended in the liquid nitrogen;

wherein the electrical resistance from the proximal end to the distal end is zero.

26. The bulk superconductor of claim 25 further including:

a first filter positioned within the hose and adapted to allow liquid nitrogen to pass therethrough and to prevent superconducting oxide particles from passing therethrough;

a second filter positioned within the hose and adapted to allow liquid nitrogen to pass therethrough and to prevent superconducting oxide particles from passing therethrough;

wherein the first filter defines the proximal end of the cryogenic hose; and wherein the second filter defines the distal end of the cryogenic hose.

27. A method of transmitting electrical energy, comprising the steps of:

a) providing a superconducting slurry having a $T_c$;

b) constraining the slurry in a container;

c) inducing electric current to flow through the slurry; and d) extracting electric current from the slurry.

28. The method of claim 27 wherein electric current is induced to flow through the slurry with a first inductance coil and wherein electric current is extracted from the slurry with a second inductance coil.

29. A superconducting slurry comprising superconducting particles having a $T_c$ suspended in a coolant having a boiling point below $T_c$.

30. The slurry of claim 29 wherein the superconducting particles are substantially spherical.

31. The superconducting slurry of claim 29 wherein the superconducting particals are monomodal.

32. The superconducting slurry of claim 29 wherein the superconducting particles are polymodal.

33. The superconducting slurry of claim 29 wherein the superconducting particles are coated with an electrical insulator.

* * * * *